(12) United States Patent
De Jong

(10) Patent No.: US 8,991,330 B2
(45) Date of Patent: Mar. 31, 2015

(54) SUBSTRATE SUPPORT STRUCTURE, CLAMP PREPARATION UNIT, AND LITHOGRAPHY SYSTEM

(75) Inventor: Hendrik Jan De Jong, The Hague (NL)

(73) Assignee: Mapper Lithography IP B.V., Delft (NL)

( * ) Notice: Subject to any disclaimer, the term of this patent is extended or adjusted under 35 U.S.C. 154(b) by 477 days.

(21) Appl. No.: 12/709,645

(22) Filed: Feb. 22, 2010

(65) Prior Publication Data
US 2010/0236476 A1 Sep. 23, 2010

Related U.S. Application Data

(60) Provisional application No. 61/154,411, filed on Feb. 22, 2009, provisional application No. 61/306,199, filed on Feb. 19, 2010.

(51) Int. Cl.
| | |
|---|---|
| *B05C 13/00* | (2006.01) |
| *G03B 27/42* | (2006.01) |
| *H01L 21/67* | (2006.01) |
| *B82Y 10/00* | (2011.01) |
| *B82Y 40/00* | (2011.01) |
| *G03B 27/58* | (2006.01) |

(Continued)

(52) U.S. Cl.
CPC ............... *H01L 21/67* (2013.01); *B82Y 10/00* (2013.01); *B82Y 40/00* (2013.01); *G03B 27/58* (2013.01); *G03F 7/707* (2013.01); *H01J 37/20* (2013.01); *H01J 37/3174* (2013.01); *H01L 21/00* (2013.01); *H01J 2237/006* (2013.01); *H01J 2237/2005* (2013.01); *H01J 2237/2007* (2013.01)
USPC ............... 118/503; 118/500; 355/53; 355/72

(58) Field of Classification Search
CPC .................... G03F 7/707; H01L 21/68735
USPC .................. 118/500, 503; 355/53, 73, 30, 72
See application file for complete search history.

(56) References Cited

U.S. PATENT DOCUMENTS

| | | |
|---|---|---|
| 5,088,006 A | 2/1992 | Del Puerto |
| 6,281,128 B1 | 8/2001 | Maury |

(Continued)

FOREIGN PATENT DOCUMENTS

| | | |
|---|---|---|
| EP | 0511928 A1 | 11/1992 |
| EP | 1732105 A2 | 12/2006 |

(Continued)

OTHER PUBLICATIONS

International Search Report for PCT/EP2010/052217 (issued Jun. 29, 2010).

(Continued)

*Primary Examiner* — Yewebdar Tadesse
(74) *Attorney, Agent, or Firm* — Hoyng Monegier LLP; David P. Owen

(57) ABSTRACT

A substrate support structure for clamping a substrate by means of a capillary force created by a liquid clamping layer having a lower pressure than its surroundings. The substrate support structure comprises a surface provided with a plurality of substrate supporting elements for holding the substrate, and the surface further comprises portions with different capillary potential for inducing, during clamping, a predetermined capillary flow within the liquid clamping layer.

21 Claims, 11 Drawing Sheets

(51) Int. Cl.
*G03F 7/20* (2006.01)
*H01J 37/20* (2006.01)
*H01J 37/317* (2006.01)
*H01L 21/00* (2006.01)

(56) References Cited

U.S. PATENT DOCUMENTS

| | | | |
|---|---|---|---|
| 7,105,463 | B2 | 9/2006 | Kurita et al. |
| 2004/0135099 | A1 | 7/2004 | Simon |
| 2005/0122505 | A1 | 6/2005 | Miyajima |
| 2005/0259236 | A1 | 11/2005 | Straaier |
| 2005/0284372 | A1* | 12/2005 | Murugesh et al. ............ 118/715 |
| 2008/0024743 | A1 | 1/2008 | Kruit et al. |
| 2009/0027649 | A1* | 1/2009 | De Boer et al. ................ 355/73 |

FOREIGN PATENT DOCUMENTS

| | | |
|---|---|---|
| JP | 2005 310933 A2 | 11/2005 |
| WO | 2008013443 A2 | 1/2008 |
| WO | 2009011574 A1 | 1/2009 |

OTHER PUBLICATIONS

Search report for NL1037754 (issued Jul. 26, 2010).

* cited by examiner

FIG. 7A   FIG. 7B

SUBSTRATE SUPPORT STRUCTURE, CLAMP PREPARATION UNIT, AND LITHOGRAPHY SYSTEM

CROSS REFERENCE TO RELATED APPLICATIONS

This application claims priority to U.S. provisional application No. 61/154,411 filed on Feb. 22, 2009, and U.S. provisional application No. 61/306,199 filed on Feb. 19, 2010. Both applications are hereby incorporated by reference in their entirety.

BACKGROUND OF THE INVENTION

1. Field of the Invention

The present invention relates to a substrate support structure for clamping a substrate on a surface thereof, a clamp preparation unit configured for use of a substrate support structure, a lithography system comprising such a substrate support structure, and an arrangement comprising a clamp preparation unit and a plurality of such lithographic apparatus.

2. Description of the Related Art

Clamping of a substrate, for example a wafer, onto a surface of a substrate support structure, for example a wafer table, is well known in the semiconductor industry, and in particular in lithography systems. In such lithography systems, the clamped substrate is patterned by exposure to incident photons or charged particles such as ions or electrons. The clamping permits the realization of high precision patterning of a target portion of the substrate surface.

One method of clamping is by sucking away air between the substrate and the substrate support structure, i.e. by creating a vacuum in between them. However, if the clamped substrate is to be processed in a vacuum environment, this method will not be effective. Various other solutions exist for clamping a substrate in a vacuum environment, for example by means of electromechanical clamping. However, this solution is not suitable for use with charged particle lithography due to the undesirable influence of the electric fields used for clamping on the beams of charged particles.

In a lithography system, the clamping of a substrate to a substrate support structure should not only be such that the substrate maintains its position with respect to the substrate support structure during exposure. The thermal contact between substrate and substrate support structure should also be such that the heat load caused by the radiation on the substrate is effectively removed so that thermal contraction and expansion remain within specifications. This heat removal may be performed by a heat dissipation arrangement within the substrate support structure, e.g. by using a phase transition in a heat absorbing material that is brought into thermal contact with the substrate support structure surface as described in international application WO2008/013443 filed by the applicant.

The surface of a substrate support structure generally used in electrostatic clamp applications to hold the substrate typically is provided with a plurality of bumps called burls. The contact area between the substrate and these burls is limited. Consequently, in particular if swift removal of heat towards a heat dissipation arrangement is desired, the transport of heat from the substrate towards the heat dissipation arrangement may be a limiting factor.

International application WO2009/011574 filed by the Applicant, describes a lithography system with a substrate support structure for clamping a substrate by means of a liquid layer. The liquid layer is arranged to induce a capillary force such that the substrate is clamped on a surface of a substrate support structure. Adhesion of the liquid to the surfaces of the substrate on the one hand and the substrate support structure on the other hand creates a circumferentially extending liquid surface, concavely extending between the two surfaces. The so-formed concave liquid surface tends to maintain its shape, even if forces are applied to remove the substrate from the substrate support structure surface.

The liquid layer may further serve the purpose of enhancing the thermal contact between the substrate and the substrate support structure surface. Such enhanced thermal contact may enable the substrate to withstand higher heat loads without being subject to excessive contraction or expansion. This is of particular importance in applications such as lithography systems where there is a desire to realize higher throughput, i.e. in terms of wafers per hour. In such applications, the wafer is subjected to relatively high energy loads which normally translate into higher heat loads on the substrate.

However, the substrate clamping mechanism using a liquid clamping layer as described in WO2009/011574 will only be present for a limited period of time, e.g. due to evaporation and/or condensation processes. For many applications a longer clamping time period is desired.

BRIEF SUMMARY OF THE INVENTION

It is an object of the invention to provide a means for clamping a substrate which addresses problems encountered in previous methods. To this end, the invention provides a substrate support structure for clamping a substrate by means of a capillary force created by a liquid clamping layer having a lower pressure than its surroundings, the substrate support structure comprising a surface provided with a plurality of substrate supporting elements for holding the substrate, the surface further comprising portions with different capillary potentials for inducing, during clamping, a predetermined capillary flow within the liquid clamping layer.

The portions with different capillary potential may further induce, during clamping, sacrificial gap development at one or more predetermined locations along the periphery of the liquid clamping layer. The surface of the substrate support structure may comprise a portion with a lower capillary potential at the perimeter of the substrate support structure surface at one or more predetermined locations while the majority of the perimeter has a higher capillary potential. At least a part of the surface portion with a lower capillary potential may take the form of a channel, and the channel may be arranged to induce a capillary flow from the channel to the periphery of the liquid clamping layer.

The substrate supporting elements may be arranged in a regular pattern with a mutual pitch, wherein the channel width is smaller than the mutual pitch. The channel may comprise a curved portion, at least a part of the channel may take the form of a spiral and/or a serpentine form. At least a part of the surface portion with a lower height level may take the form of one or more channels which may comprise a curved portion, and at least a part of the channels may take the form of a spiral or a serpentine form. The surface area of the one or more channels may cover less than 25% of the substrate support structure surface, and may be homogeneously spread over the substrate support structure surface.

A surface portion of the substrate support structure with a lowest capillary potential may be provided at the perimeter of the surface, and a surface portion with a lowest height level may be provided at a circumference of a surface portion with a higher height level. The surface may be provided with elevated structures for forming a plurality of compartments, and the height of the elevated structures may be less than the height of the substrate supporting elements.

The portions with different capillary potential may have different height levels to provide a difference in capillary potential. The portions with different capillary potential may have different affinity for the clamping liquid to provide a difference in capillary potential, and may have a differing surface treatment, surface material, or surface coating, to provide a difference in capillary potential.

In another aspect, the invention provides a substrate support structure for clamping a substrate by means of a capillary force exerted by a liquid clamping layer, the substrate support structure comprising a surface provided with a plurality of substrate supporting elements for holding the substrate, and elevated structures for forming a plurality of compartments. The height of the elevated structures may be less than the height of the substrate supporting elements.

The substrate support structure may further comprise a liquid removal system for removing liquid circumferential to the surface, and the liquid removal system comprises a gas distribution system. The gas distribution system may comprise at least one gas inlet for providing gas, and at least one gas outlet for removing gas, and may have a plurality of gas inlets and a plurality of gas outlets at equidistant positions with respect to each other. The substrate support structure may further comprise a sealing structure circumscribing the substrate support structure surface such that gas provided by the gas distribution system can flow between the substrate support structure surface and the sealing structure. The sealing structure may have a height level corresponding with the height level of the plurality of substrate supporting elements. The substrate supporting elements may be arranged in a regular pattern with a mutual pitch, and the distance between the sealing structure and the nearest substrate supporting elements exceeds said pitch.

The liquid used in the liquid layer for the substrate support structure may comprise water, and the substrate support elements take the form of burls.

In yet another aspect, the invention comprises a clamp preparation unit, the unit comprising a housing for providing a controlled pressure environment, at least one load port for loading a substrate into and unloading a substrate out of the housing respectively, and a substrate transfer unit for moving the substrate within the housing, wherein the clamp preparation unit is configured to accommodate a substrate support structure of any one of the preceding claims, and wherein the clamp preparation unit is further configured to clamp a substrate on the substrate support surface of the substrate support structure by means of a liquid clamping layer. The clamp preparation unit may further comprise a liquid dispenser for dispensing liquid on the substrate support structure surface.

In a further aspect, the invention comprises a lithography system comprising a lithographic apparatus, the apparatus comprising a radiation system to provide a patterned beam of radiation, a substrate support structure to support a substrate, and an optical system to project the patterned beam of radiation onto a target portion of the substrate, wherein the substrate support structure is in a form as described above. The beam of radiation may be formed by a plurality of charged particle beamlets, and may be electron beamlets.

In still a further aspect, the invention comprises an arrangement comprising a clamp preparation unit and a lithography system, both as described above, and wherein the clamp preparation unit is configured to serve the lithography system.

In yet a further aspect, the invention comprises a method of clamping a substrate to a substrate support structure, the method comprising providing a clamp preparation unit as described above, applying liquid on the surface of the substrate support structure to form a liquid layer, placing a substrate on the liquid layer, and forming a clamping layer between the substrate and the substrate support structure by moving excess liquid away from the substrate support structure.

In yet a further aspect, the invention comprises a substrate comprising a first surface side arranged for patterning and a second surface side arranged for being clamped to a substrate support structure by means of a capillary force created by a liquid clamping layer having a lower pressure than its surroundings, wherein the second surface side comprises portions with different capillary potential for inducing, during clamping, a predetermined capillary flow within the liquid clamping layer.

It will be evident that the presently invented principle may be set into practice in various ways.

BRIEF DESCRIPTION OF THE DRAWINGS

Various aspects of the invention will be further explained with reference to embodiments shown in the drawings wherein:

FIGS. 7A-7C are top view of the substrate support structure of FIG. 6 further schematically illustrating the concept of reclamping.

DESCRIPTION OF ILLUSTRATIVE EMBODIMENTS

The following is a description of various embodiments of the invention, given by way of example only and with reference to the drawings.

Figure 1:
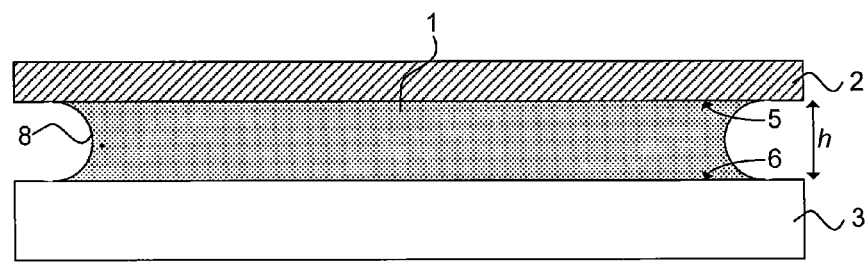
FIG. 1 is a sectional view schematically illustrating a clamping layer between two substantially flat structures.

FIG. 1 is a sectional view schematically illustrating a layer 1 of a liquid, between a first substrate 2, e.g. a wafer, and a second substrate 3, e.g. a substrate support structure like a wafer table. A suitable liquid for use in applications related to lithographic processing is water. The arrangement comprising a first substrate 2 and a second substrate 3 clamped together by means of a liquid layer 1, further referred to as clamping layer, in a way as shown in FIG. 1 will hereafter be referred to as a "clamp".

Because the thickness of the clamping layer is generally very small, and in such cases capillary forces are of importance, the clamping layer may also be referred to as capillary layer. The first and second substrates 2, 3 have a substantially flat surface 5, 6 respectively. The nominal distance between the opposing surfaces 5, 6 of the first and second substrates 2, 3 is given by height h. The clamping layer 1 has an outer liquid surface 8, also referred to as meniscus, which is generally concavely shaped due to adhesive connection of the liquid to the first substrate 2 and the second substrate 3. In case water is used as a clamping liquid, Van der Waals forces arising from the dipolar arrangement of the $H_2O$— molecule cause molecules to adhere to each other (surface tension) and to other surfaces (adhesion).

The concaveness of the outer liquid surface 8, also referred to as meniscus curvature, depends on the contact angle between the outer liquid surface 8 and the surface 5 of the first substrate 2, and on the contact angle between the outer liquid surface 8 and the surface 6 of the second substrate 3. The respective contact angles depend on the liquid used in the clamping layer 1 as well as on the material properties of the two substrates 2, 3. Furthermore, the meniscus curvature provides a pressure difference across the outer liquid surface 8. A higher meniscus curvature, i.e. a more concave outer surface, provides a higher pressure difference. More details with respect to a clamping layer holding together two structures with substantially flat opposing surface is provided in international patent application WO2009/011574, which is incorporated herein in its entirety.

Figure 2A:
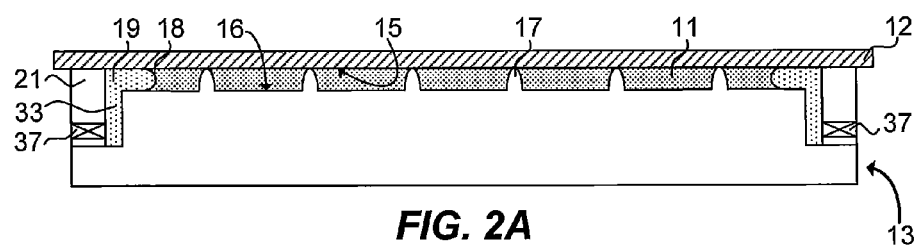
FIG. 2A is a sectional view of a substrate support structure suitable for clamping a substrate by means of a clamping layer.
Figure 2B:
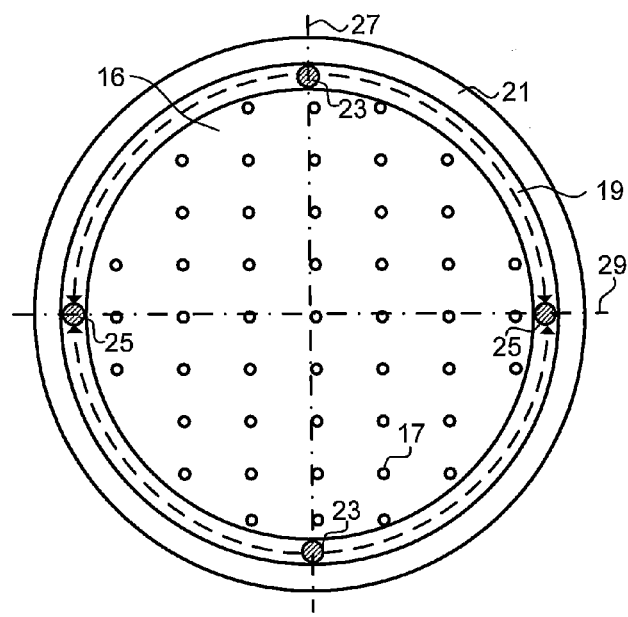
FIG. 2B is a top view of the substrate support structure of FIG. 2A.

FIGS. 2A and 2B schematically show a sectional view and a top view of a substrate support structure 13 suitable for clamping a substrate 12 by means of a clamping layer 11 in a way as described with reference to FIG. 1. The substrate support structure 13 comprises a surface 16 provided with a plurality of substrate supporting elements 17.

The substrate supporting elements 17 are arranged to define and maintain a distance between the first substrate 2 and the second substrate 3. They may take the form of burls as shown in FIGS. 2A, 2B. Additionally or alternatively, a plurality of spacers, e.g. glass grains, $SiO_2$ grains or the like may be dispersed uniformly over the surface 16 to serve as substrate supporting elements.

The substrate supporting elements 17 may be arranged to reduce deformation of the first substrate 2 caused by the clamping force exerted by the clamping layer 11. Their presence may for example prevent the occurrence of substrate bow. Furthermore, the presence of substrate supporting elements 17 may reduce the influence of contamination by particles on the backside 15 of the substrate 12.

The pitch of the substrate supporting elements 17 may be based on the requirements set for the maximum substrate deflection caused by the clamping force of the clamping layer. The contact surface per substrate supporting element 17 is such that it is sufficient to withstand deformation and/or destruction under the applied clamping pressure. Preferably, edges of a contact element are rounded to reduce the possibility of particle contamination, e.g. during cleaning operations. A typical value for the diameter of a burl with a circular contact area would be in the range of 10-500 microns, for example 200 microns. A typical value for the pitch of a plurality of burls would be in the range of 1-5 mm, for example 3 mm.

The nominal height of the substrate supporting elements 17 determines the distance between the substrate 12 and the surface 16 of the substrate support structure 13. The nominal height further has an influence on the obtainable clamping pressure. Selection of the nominal height of the substrate supporting elements 17 generally will be a trade off between a desirable clamping pressure and a reasonable risk for distortion by particles.

A lower height generally increases the obtainable clamping pressure. A higher clamping pressure generally improves the clamp stability. Additionally, a lower nominal height reduces the thickness of the clamping layer, and consequently improves heat transfer between the substrate 12 and the substrate support structure 13.

On the other hand, although there are not many wandering particles present in a vacuum system, their appearance on the substrate supporting structure surface may cause serious local instabilities, in particular if their size exceeds the nominal height of the substrate supporting elements 17. Consequently, a higher height reduces the chance of being confronted with such negative impact.

Other parameters that may be varied to obtain a desirable clamping pressure include material properties of the substrate 12, material properties of the surface 16 of the substrate support structure 13, the surface area of the surface 16, the shape and number of the substrate supporting elements 17, the substrate supporting element pitch, and the type of liquid used to form the clamping layer 11. As a specific measure, one or both of the contacting surfaces of the substrate 12 and the substrate support structure 13 may be surface treated, or coated with a material for influencing a contacting angle between the liquid forming the clamping layer 11 and the relevant contacting surface.

The surface 16 of the substrate support structure 13 may be circumscribed by a moat 19 or similar structure. The moat 19 can be used in the procedure to establish the clamp. For this purpose, the moat 19 may be connected to a liquid conditioning system and/or a gas conditioning system. In the procedure of establishing the clamp one or more actions including supply of clamping liquid, removal of excess liquid and distribution of dry gas may be performed via the moat 19. The gas distribution action preferably includes distributing a dry gas along the circumference of the outer surface of the substrate supporting structure surface to enable further removal of excess clamping liquid so as to enable establishment of the clamp. Suitable dry gases for use in the gas distribution action include nitrogen and inert gases like argon.

The liquid conditioning system may be configured to supply liquid to the substrate support structure surface and/or, after placement of the substrate on top of a liquid layer, to remove liquid underneath the substrate to enable formation of clamping layer. Further details regarding the formation of a clamping layer by using external supply of liquid and a liquid removal system using a moat as depicted in FIGS. 2A, 2B is described in detail in U.S. provisional patent application 61/154,411, which content is herein incorporated by reference in its entirety.

In its turn, the moat 19 may be circumscribed by a sealing structure 21. The sealing structure 21 may limit leakage of vapor originating from the clamping layer 11, when present to the surroundings, e.g. a vacuum chamber. Preferably, the top side of the sealing structure 21 has a level corresponding in height with the nominal height of the plurality of substrate supporting elements 17. Such an arrangement increases the efficiency of vapor leakage prevention, which is in particular an issue in a vacuum environment.

The sealing structure 21 may comprise one or more elastically deformable elements like O-rings, e.g. made of viton or rubber. Such O-rings may be inserted in a part of the substrate support structure 13 with reduced height such that the top side of the O-ring is set to the level mentioned above. The O-ring may be provided with an incision at a radial side, e.g. the radial side facing the center of the substrate support structure 13, such that the O-ring can be compressed between substrate support structure 13 and substrate 12 without undue force requirement, but sufficient to limit leakage of vapor. Alternatively, as in FIG. 2A, the sealing structure 21 may comprise a vapor limiting ring-shaped structure. The vapor limiting ring-shaped structure closes off the circumferential opening facing the clamping liquid surface.

As mentioned earlier, the moat 19 may be in contact with a gas distribution system, e.g. via one or more gas inlets 23 and one or more gas outlets 25. If a sealing structure 21 is present, a gas flow may be established between the substrate supporting structure surface 16 provided with a liquid layer and the sealing structure 21, thus forming a channel flow as shown in FIG. 2B by the dashed arrows.

The one or more gas inlets 23 and the one or more gas outlets 25 may be provided along the moat 21 in a symmetric fashion. In the embodiment of FIG. 2B, there are two gas inlets 23 and two gas outlets 25. The gas inlets 23 and gas outlets 25 may be positioned in such a way that a first virtual line 27 formed by connecting the two gas inlets 23, and a second virtual line 29 formed by connecting the two gas outlets 25 are substantially perpendicular with respect to each other.

In most figures, no reference is made to a moat 19 and/or a sealing structure 21 or any equivalents of such components. It must be understood that, although not explicitly shown, the clamp in these figures also comprises means to contain vapor evaporated from the clamping layer. Direct contact between the outer surface of the clamping layer and a vacuum environment would severely limit the lifetime of the clamp.

Figure 3:
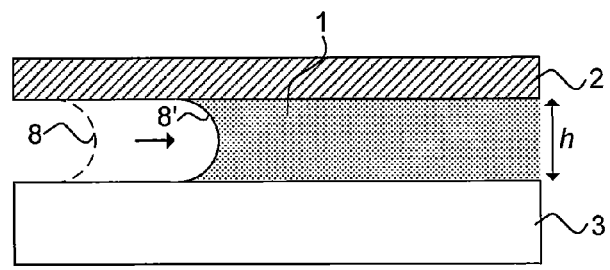
FIG. 3 is a sectional view schematically illustrating the process of evaporation along an outer surface of a clamping layer.

FIG. 3 is a sectional view schematically illustrating the evaporation process that will take place during the clamping action performed by means of a liquid clamping layer 1. Such evaporation at the liquid layer interface, i.e. evaporation at the concave liquid surface, has a negative impact on the stability of the clamp. Due to evaporation, the position of the outer liquid surface 8 may shift towards a new position to form outer liquid surface 8'. As a result of that shift, the surface area covered by the liquid clamping layer 1 reduces, and thus the surface area used to clamp the substrates 2 and 3 together reduces. As a result, the stability of the clamp decreases. If the surface area covered by the clamping layer 1 becomes too low, the clamp may break up, and the substrates 2 and 3 are no longer held together.

Figure 4:
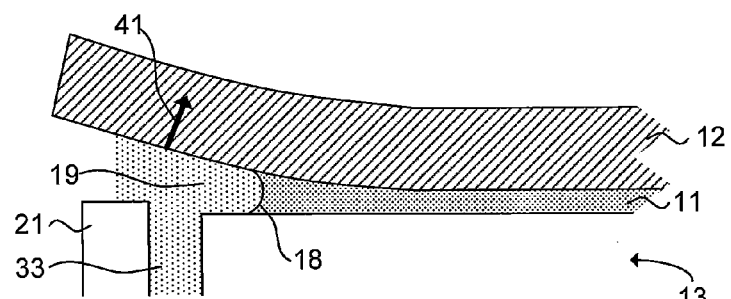
FIGS. 4 and 5A schematically illustrates the concept of substrate peeling.

While examining the origin of clamp failure, the inventors identified that one of the main mechanisms that induces the breaking up of a clamp is a mechanism further referred to as substrate peeling. FIG. 4 schematically illustrates the concept of substrate peeling. Without wishing to be bound by theory, it is believed that due to unavoidable variation in evaporation along the outside surface of the liquid clamping layer 11, at a point with higher evaporation the edge of the substrate 12 starts to lift away from the substrate support structure 13. The movement of lifting is schematically represented in FIG. 4 by the arrow 41. Due to the peeling, vapor may more easily leak away from the liquid clamping layer 11. Additionally, the surface area of the outer liquid surface 18 of the liquid clamping layer 11 increases, which leads to an increase in evaporation rate. Furthermore, the local peeling causes the clamping layer 11 to shift away from the area in which the peeling occurs. Such shift leads to further unclamping. Thus, local peeling may limit the lifetime of the clamp significantly.

As mentioned earlier, it is desirable to extend the average lifetime of a clamp, in particular for use in lithography-related applications. Surprisingly, such lifetime extension can be realized by introducing portions of the substrate support structure with a different capillary potential. The capillary potential can be defined as the potential to attract liquid by capillary pressure. A surface portion with a high capillary potential is attractive for the clamping liquid, while a surface portion with a lower capillary potential is less attractive. This characteristic can be used to create a flow of the clamping liquid in a predetermined direction to ensure that evaporating liquid is replenished at the critical locations.

In particular, the inventors discovered that a substrate support structure provided with a surface comprising portions with different capillary potentials can result in a clamp that on average lasts for a longer period of time. The different surface portions should be arranged such that a predictable capillary flow within the clamping layer is established. The capillary flow may be induced by movement of liquid within the clamping layer from a point with low capillary potential to a point with higher capillary potential, particularly a point at the outer surface with a high evaporation rate. Based on the particular circumstances the capillary flow may be directed in a predictable way by suitable arrangement of the different surface portions on the surface of the substrate support structure.

The capillary potential of a surface portion may be influenced in several ways. Throughout this description, embodiments of the invention will be described with reference to the use of different height levels. The use of different height levels is a robust way to obtain portions with different capillary potential. A surface portion with a lower height level will accommodate a relatively thick clamping liquid layer between the substrate and the surface portion. The capillary potential of this surface portion will be relatively low compared to a surface portion with a higher height level and a relatively thin clamping liquid layer.

Other ways of achieving different capillary potentials for surface portions include, but are not limited to surface treatment, selection of different materials for each surface portion, and the providing of one or more coatings on the surface portions. In case of water, for example, a surface portion may be made substantially hydrophilic, or a surface portion may be made substantially hydrophobic, or both techniques may be combined. Water applied to the surface will then be attracted to the relatively more hydrophilic surface portions.

Figure 5A:
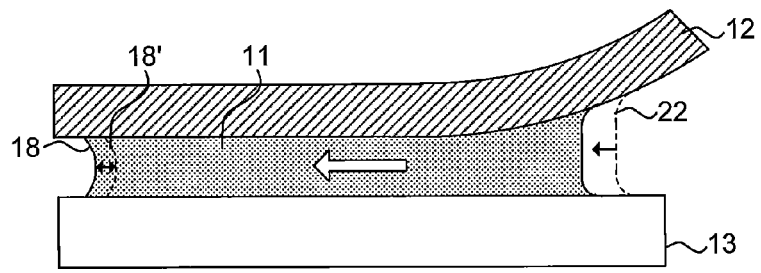

FIG. 5A shows the concept of substrate peeling. In this case, the substrate lifts at the right hand side, which enlarges the outer surface of the clamping layer 11 at this location. Due to the lifting of the substrate 12, more vapor will leak into the surrounding vacuum system near the lifted substrate region. To compensate for the loss of vapor, the evaporation of clamping liquid increases. Furthermore, the substrate lifting causes a stretching of the outer surface 22 near the lifted region of the substrate 12. This stretching induces a decrease in meniscus curvature, i.e. a less concave outer surface. As mentioned earlier, a less concave outer surface corresponds to a smaller pressure difference across the surface. As the vapor pressure remains about the same along the outer surface, a pressure difference arises within the clamping layer 11. In FIG. 5A, the pressure within the clamping layer at the right outer surface will be higher than the pressure within the clamping layer at the left outer surface. Or, in other words, the capillary potential at the left outer surface is higher than the capillary potential at the right outer surface, and as a result, a capillary flow is induced within the clamping layer from the right towards the left, schematically denoted by the white arrow. This capillary flow may enable the outer surface 18 at the left side to keep its original position. Alternatively, if the left outer surface did already retract to form an outer surface 18', the capillary flow may allow the outer surface to return to its original position. The retraction and return action is schematically denoted by the double arrow. At the right hand side of the clamp in FIG. 5A, the capillary flow causes the outer surface 22 of the clamping layer 11 to retract as schematically denoted with the arrow. Due to the removal of liquid underneath the substrate 12 the area covered by the clamping layer 11 decreases. The lack of clamping force at the right hand side may cause further lifting of the edge of the substrate 12 which may result in further degradation of the clamp and may eventually lead to clamp failure.

Figure 5B:
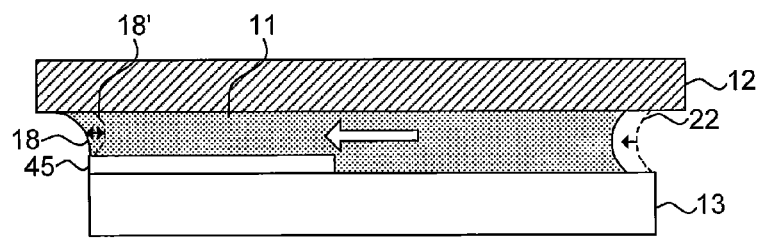
FIG. 5B schematically illustrates the concept of an embodiment of the invention.

FIG. 5B schematically shows the concept utilized in several embodiments of the invention. The inventors have realized that similar differences in the meniscus curvature can be induced by forming a substrate support structure 13 with a surface comprising portions with different height levels. In FIG. 5B, element 45 represents a portion of the substrate support structure surface with an elevated height level as compared to the remainder of the surface.

In equilibrium, the meniscus on the left hand side and the right hand side have a substantially identical curvature. As a result of evaporation, the outer surface 18 on both sides may recede slightly. As can be readily seen, the height of the liquid clamping layer 11 between the substrate 12 and the substrate support structure 13 at positions within the area covered by element 45 is smaller than the height of the liquid clamping layer 11 at positions not covered by element 45. Retraction of the outer surface 18 at the left hand side will result in a decrease of meniscus height and an increase of its curvature. At the right hand side, retraction of the outer surface does not have a significant effect on the size and shape of the meniscus. As a result, a capillary flow is induced in a similar way as discussed with reference to FIG. 5A (represented by white arrow). The capillary flow allows for replenishment of liquid at the perimeter of the clamping layer at the left hand side such that the outer surface 18 regains its position, while the outer surface at the right hand side recedes from a position 22 towards a more inward position.

Figure 6:
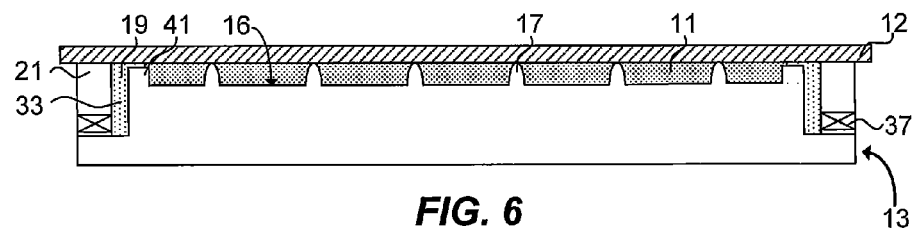
FIG. 6 is a sectional view of a substrate support structure according to an embodiment of the invention.

FIG. 6 is a sectional view of a substrate support structure 13 supporting a substrate 12 according to an embodiment of the invention. The substrate support structure 13 of FIG. 6 comprises a circumferential rim 41. The circumferential rim 41 provides a smaller distance between the substrate support structure 13 and the substrate 12. The nominal distance between the substrate support structure 13 and the substrate 12, in FIG. 1 referred to as height h, is typically about 3-10 microns. The distance between the circumferential rim 41 and the substrate 12 would typically lie in the range of 500 nm to 1.5 microns. Preferably, the circumferential rim 41 has a height being less than 1 micron smaller than the nominal height of contact elements provided on the surface 16 of the substrate support structure 13.

Figure 7C:
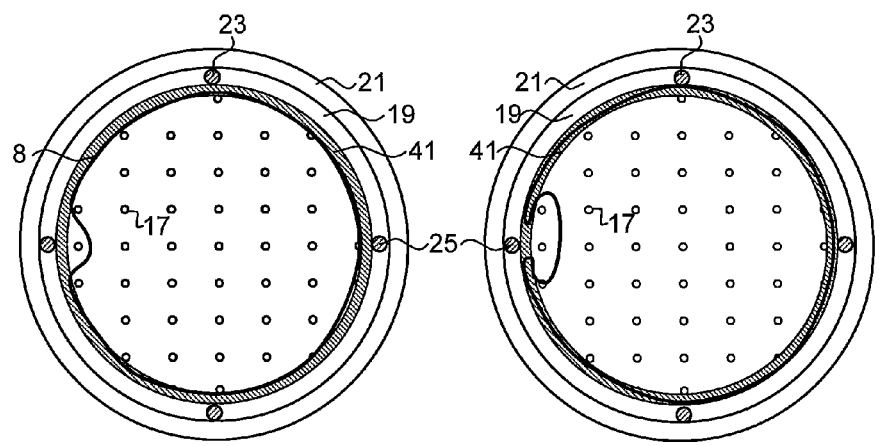
Figure 7C:
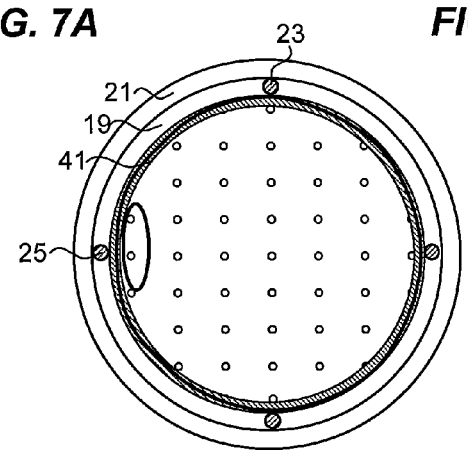

Without wishing to being bound by theory, the circumferential rim 41 is believed to limit substrate peeling in a way described with reference to FIGS. 7A-7C. showing top views of the substrate support provided with a clamping layer. Although the presence of a circumferential rim 41 has been discussed with reference to FIG. 6, the use of such circumferential rim 41 is not limited to this embodiment.

First, as liquid evaporates from the outer surface 8, it will recede into the small gap between the circumferential rim 41 and the substrate 12. Due to non-uniform evaporation, the outer surface 8 may locally recede further inwards as schematically shown in FIG. 7A. The pressure difference over the smaller gap between the circumferential rim 41 and the substrate 12 is much larger than the pressure difference would be in the main clamping area, e.g. about 1 bar versus about 200 mbar respectively. In other words, the capillary potential at the circumferential rim 41 is higher than the capillary potential in the main clamping area. When the outer surface 8 reaches the inner side surface of the circumferential rim 41 due to evaporation, the surface encounters the larger distance between substrate 12 and substrate support structure 13. The lower pressure difference in this region causes a small amount of liquid to flow into the gap between the circumferential rim 41 and the substrate 12 as is schematically shown in FIG. 7B. The flow will continue until the gap between the circumferential rim 41 and the substrate 12 is completely filled as shown in FIG. 7C. A void will be left in the main clamping region. The void is entirely surrounded by a liquid layer. Effectively, the lost capillary clamping area due to evaporation has been moved inwardly. The outer capillary surface remains at the same position. As a result, the substrate edge will not peel off easily, and the clamp lifetime will be extended.

Figure 8A:
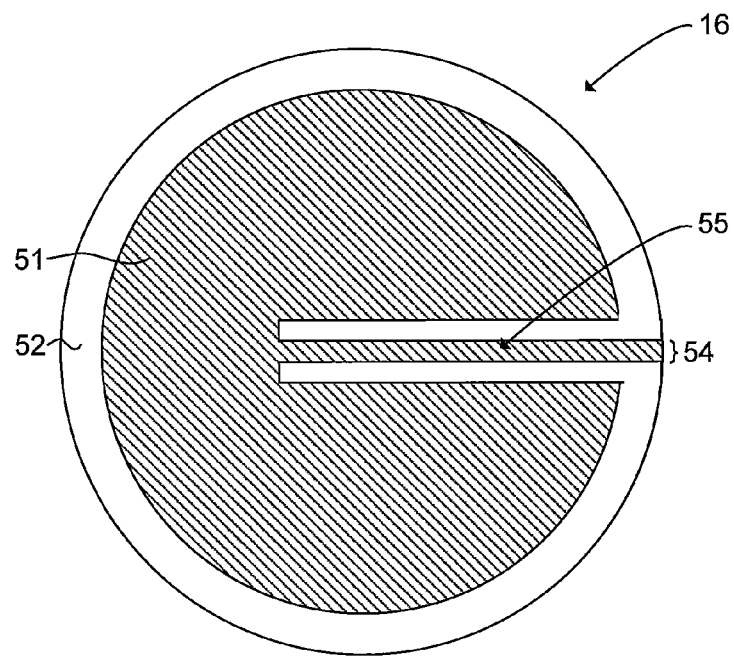
FIG. 8A is a top view of a substrate support structure according to another embodiment of the invention.

FIG. 8A schematically shows a top view of a surface 16 of a substrate support structure according to an embodiment of the invention. For reasons of clarity some additional structures that may be present, e.g. a moat and/or sealing structure shown in the other drawings, are not shown in FIG. 8A. In this embodiment, the surface comprises portions of two different height levels. A portion of the surface having a first height level is represented by the hatched area (direction hatching from top left to bottom right), hereafter referred to as first portion 51. A portion of the surface having a second height level is represented by the unhatched area, hereafter referred to as second portion 52.

The height level of the first portion 51 is lower than the height level of the second portion 52. If a liquid clamping layer is formed on top of the substrate support structure surface 16, the thickness of the liquid clamping layer on top of the second portion 52 will be less than its thickness on top of the first portion 51, for example 2-4 microns, preferably 3 microns, versus 3-10 microns, preferably 5 microns, respectively.

Figure 8B:
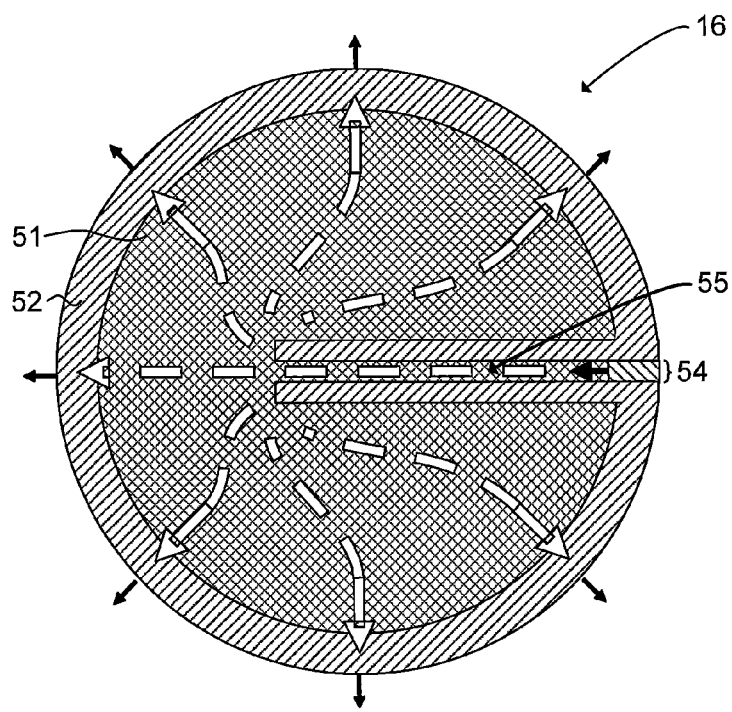
FIG. 8B is a top view of the substrate support structure of FIG. 8A provided with a clamping layer.

FIG. 8B schematically shows a top view of the substrate support structure surface 16 of FIG. 8A covered by a clamping liquid layer (schematically represented by the hatched profile with hatching from bottom left to top right). For clarity, the substrate is not shown. The outer surface of the liquid clamping layer is predominantly contacts the portion of the substrate support structure surface 16 with a higher height level, i.e. second portion 52. However, at a single position, i.e. the position denoted by reference number 54, the outer surface is in contact with the portion of the surface 16 with lower height level, i.e. first portion 51. As explained with reference to FIG. 5B, retraction of the outer surface will be concentrated at this gap position, further referred to as a sacrificial gap.

In FIG. 8B, the outer surface is retracting in the direction of the large black arrow. As explained with reference to FIGS. 5A, 5B, a capillary flow (schematically shown by the white arrows in FIG. 8B) is induced within the clamping layer. The capillary flow allows for the supply of liquid to the outer surface of the liquid clamping layer in contact with the second portion 52 so as to limit retraction of the outer surface of the clamping liquid layer due to evaporation (small black arrows) at the perimeter in contact with the second portion 52.

The height difference between the height level of the first portion 51 and the height level of the second portion 52 is such that flow resistance can be overcome by capillary pressure differences. Furthermore, in order to prevent retraction of the outer surface at the perimeter of the clamping layer in contact with the second portion 52, the flow rate of the capillary flow may be arranged so that it can keep pace with the evaporation rate of clamping liquid at the outer surface of the clamping layer.

By allowing retraction of the outer surface at specific predetermined locations, i.e. locations of the outer surface located in contact with the first portion 51, and compensating for evaporation of clamping liquid from the remainder of the outer surface, i.e. locations of the outer surface in contact with the second portion 52, the majority of the outer surface of the liquid clamping layer is kept in place during the clamping process. As a result, the clamp lifetime can be extended.

The design of the distribution of the first portion 51 and the second portion 52, as well as the location and number of one or more sacrificial gaps 54 may determine to what extent the clamp lifetime can be extended. The design shown in FIGS. 8A, 8B shows a single location along the perimeter of the substrate support structure surface with a lower height level, i.e. a single option for developing a sacrificial gap. To lengthen the time during which there is only retraction of the outer surface of the clamping layer via the single sacrificial gap, the first portion 51 comprises a portion that takes the form of a channel 55. Preferably, the width of such channel would be smaller than the pitch of substrate supporting elements, e.g. burls. For example, if the pitch of burls would be about 3 mm, the width of the channel could be about 0.5-3 mm, e.g. 1.5 mm.

Figure 9:
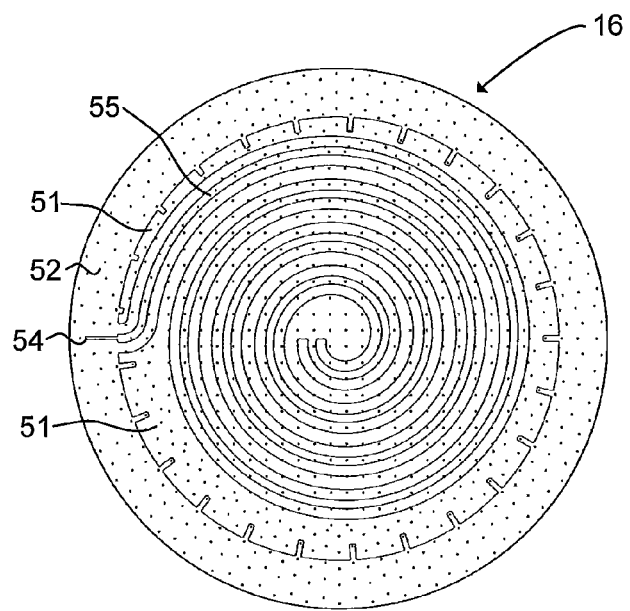
FIG. 9 is a top view of a substrate support structure according to yet another embodiment of the invention.

In order to further lengthen the lifetime of the clamp, the channel may comprise a curved portion. In an even further embodiment, the channel may take the form of a spiral, an example of which is schematically shown in FIG. 9. The length of such a channel can be very large. For example, in case of a substrate with a diameter of 300 mm, and an allowable void area within the liquid clamping layer of 20% of the total area, a channel with a channel width of 1.5 mm could reach a length of 6000 mm. Such long channel length increases the period during which evaporation takes place at a specific predetermined location at the outer surface of the clamping layer.

In the embodiment of FIGS. 8A, 8B, the channel extends from a predetermined location 54 along the perimeter with the lower height level. The predetermined location 54 is located such that the outside surface of the clamping layer as initially established contacts the channel.

The channel in the embodiment of FIG. 9 does not start at the perimeter of the substrate support structure surface, but starts at a location slightly radially inwards therefrom. Such position allows the liquid clamping layer to stabilize such that its outside surface is located at a small radial distance from the perimeter of the substrate support structure surface as well. As a result, edge influences as well as influences related to condensation, which will be discussed later, may be reduced.

Although FIGS. 8A, 8B depict embodiments having a surface provided with a single sacrificial gap, surface designs of the substrate support structure that allow for the development of multiple sacrificial gaps are possible. The creation of more sacrificial gaps, e.g. three equally spaced from each other along the circumference of the outer surface of the clamping layer reduces the capillary flow distance between the position of the retracting surface and the locations along the outer surface of the clamping layer to which liquid is supplied. As a result, the required driving force for inducing a capillary flow for resupplying liquid to the outer surface located on top of the second portion 52 such that the outer surface of the liquid clamping layer maintains its position at these locations may be reduced.

Experiments modeling substrate support structures with a surface that comprises two different height levels have shown that it is beneficial to limit the percentage of the surface portion with a lower height level related to the one or more channels to a surface area that covers less than 25%, preferably less than 20%, of the entire area of the liquid clamping layer. If the one or more channels cover more space, the improved clamping performance caused by the use of a substrate support structure surface with different height levels may decrease.

Figure 10A:
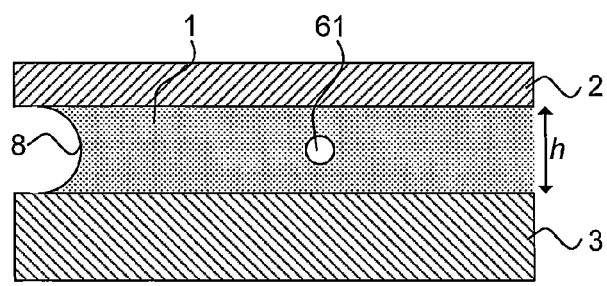
FIGS. 10A, 10B schematically illustrate the concept of void formation and/or cavitation as a result of formation of a vacuum.
Figure 10B:
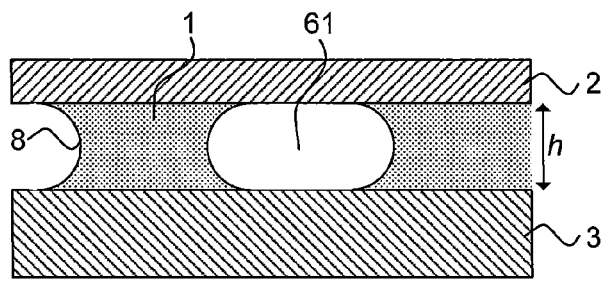

If pre-existing bubbles are present in the clamping liquid used to prepare the liquid clamping layer, introduction of the clamp into a vacuum environment will lead to expansion of such bubbles within the clamping layer as is schematically demonstrated in FIGS. 10A and 10B. The size of an initially small bubble 61 as shown in FIG. 10A can grow by several orders of magnitude as shown in FIG. 10B if ambient pressure decreases, e.g. from 1 bar to 20-40 mbar, a typical value for the vapor pressure in the surroundings of the outer surface of the liquid clamping layer in case the clamping liquid is water. As can be readily seen, a bubble of the size of bubble 61 in FIG. 10B may seriously influence the clamping strength, at least locally, and may have a negative influence on the stability of the clamp.

Another mechanism that may lead to clamp instability is spontaneous void formation, for example caused by liquid cavitation or by dissolved gas precipitation in the clamping layer. Voids formed by cavitation may grow in a similar way as discussed before with respect to pre-existing bubbles if the clamp is brought into a vacuum environment. The resulting voids may have a negative influence on the clamp stability.

Embodiments of the substrate support structure 13 like the one shown in FIG. 2A, may be designed in such a way that cavitation effects are minimized. Without wishing to be bound by theory, it is understood that there is a critical radius for cavities. If the radius of a cavity becomes larger than this critical radius, the cavity may grow extensively. By designing a substrate support structure 13 that enables the formation of a clamping layer with a smallest dimension, i.e. a thickness h, that is smaller than this critical radius, cavitation may be largely limited. Experiments have shown that a clamping layer of water with a maximum thickness h in the order of 3-10 microns does not appear to experience cavitation.

Figure 11:
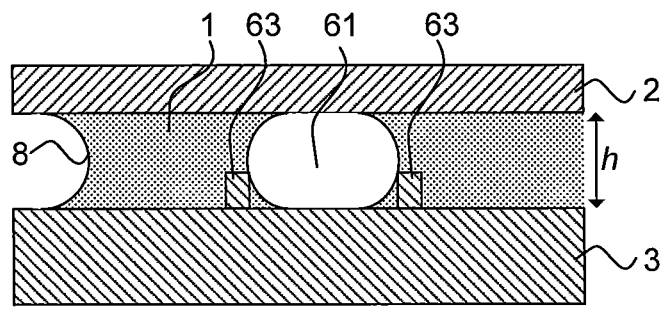
FIG. 11 schematically illustrate the concept of void enclosure according to embodiments of the invention.

FIG. 11 schematically illustrates the concept of void enclosure which may be used in some embodiments. In these embodiments, the surface is further provided with elevated structures 63 for forming a plurality of compartments. If a small bubble 61 is present during preparation of the clamping layer, for example a bubble as shown in FIG. 10A, instead of expansion towards a large void due to an ambient pressure decrease as shown in FIG. 10B, the expansion of the bubble 61 may be limited by the elevated structures 63. The maximum size of the expanded bubble is then determined by the size of the compartment enclosing the bubble. Additionally, besides limiting expansion of a bubble 61, the compartment formed by the elevated structures 63 may be arranged to confine the bubble 61. Preventing movement of the bubble may improve the stability of the clamp. With the presence of the elevated structures 63, the influence of spontaneous void development and/or cavitation may thus be further reduced, which may lead to an improved reliability and stability of the clamp.

Figure 12:
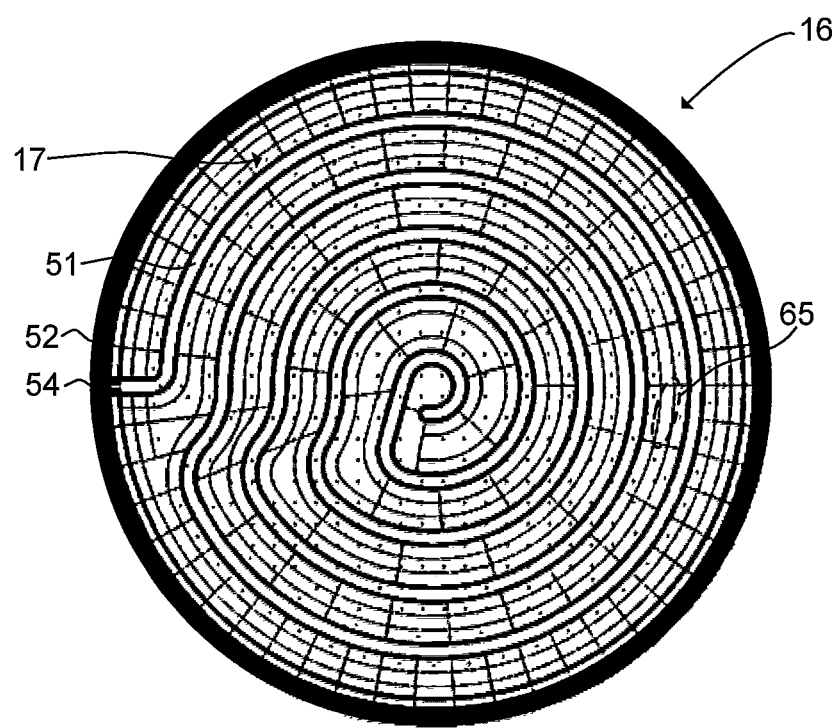
FIG. 12 is a top view of a substrate support structure according to yet another embodiment of the invention.

FIG. 12 is a top view of a substrate support structure according to yet another embodiment of the invention. In this embodiment, just like the embodiment shown in FIG. 9, at least a part of the portion 51 with a lower height level takes the form of a channel in a spiral shape. In contrast to the embodiment shown in FIG. 9, the spiral shape is such that the surface portion 51 with a lower height level is homogeneously spread over the substrate support structure surface 16. Furthermore, the surface 16 is provided with elevated structures forming compartments 65 for allowing restriction of bubbles in a way as described with reference to FIG. 11.

Figure 13A:
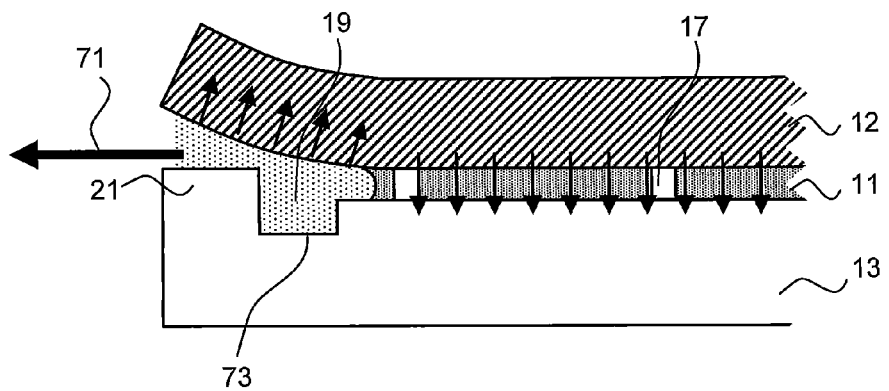
FIG. 13A schematically illustrates the concept of vapor emission towards external surroundings.

To further limit release of vapor evaporated from the liquid clamping layer towards outside surroundings, e.g. a vacuum chamber, the plurality of substrate supporting elements may be spaced at a minimal distance away from the perimeter of the substrate support holder surface 16. This measure may be used for any of the embodiments of the substrate support structure. FIG. 13A schematically illustrates the concept of vapor emission towards external surroundings. Vapor evaporated from the liquid clamping layer is released in the moat 73. If the vapor pressure exceeds a certain threshold value the substrate will be lifted slightly (represented by the arrows pointing upwards) such that the vapor "escapes" towards its surrounding, schematically represented by arrow 71.

Figure 13B:
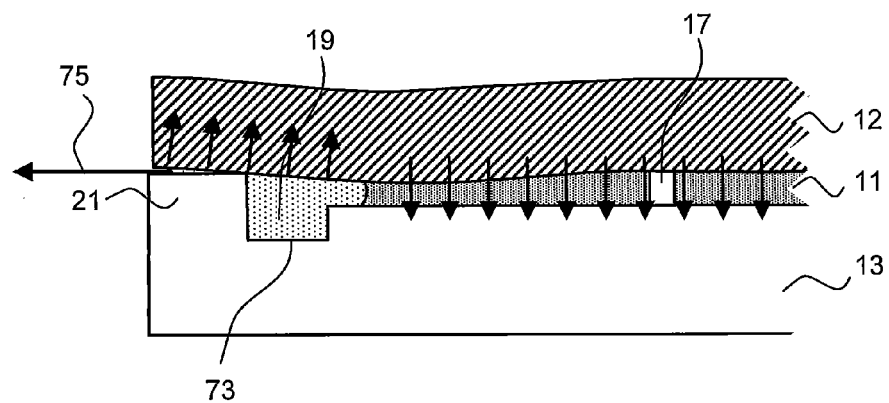
FIG. 13B schematically illustrates the effect of alternative placement of substrate supporting elements in comparison to FIG. 13A.

In particular in lithography applications performed in vacuum surroundings, it is desirable to keep the extent of vapor emission into a vacuum system to a minimum. FIG. 13B schematically illustrates the situation in case the outer substrate supporting element of the surface of FIG. 13A is removed. As a result, the substrate portion extending from the last substrate supporting element is increased which causes the substrate to be pulled level against the sealing structure 21. As a result, the release of vapor towards external surroundings will be reduced, schematically represented by arrow 75 which is substantially smaller than arrow 71 in FIG. 13A.

Figure 14A:
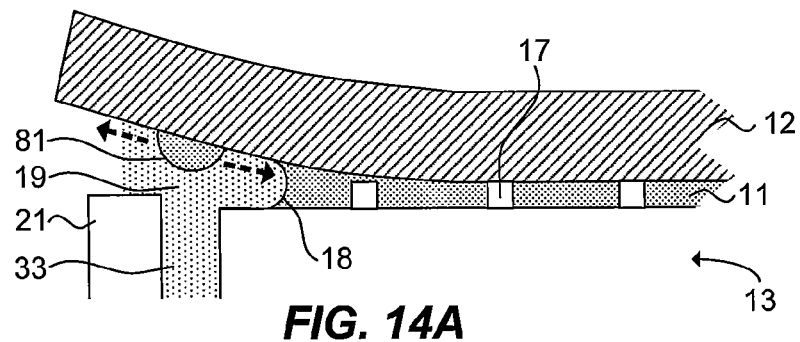
FIG. 14A schematically depicts condensation in a substrate support structure using a liquid clamping layer.

FIG. 14A schematically depicts an effect caused by condensation in a substrate support structure using a liquid clamping layer. Condensation occurs when a vapor is cooled to its dew point. The dew point is dependent on parameters like temperature, volume and pressure. Vapor being present in the region 19 along the moat circumscribing the outer clamping surface 18 may condense on the substrate 12 if the temperature of the substrate 12 is sufficiently cooler than the vapor temperature. A condensation droplet 81 thus formed may move along the substrate surface as schematically depicted with the dashed arrows. If the condensation droplet 81 moves towards the outer surface 18 of the clamping layer 11, the droplet 81 may be absorbed by the clamping layer 11 which will result in an increase of liquid content within the clamping layer. Just as discussed with reference to evaporation, the added liquid will be equally spread throughout the clamping layer.

However, if the clamping layer has an outer surface with a concave surface that is equal at both sides, and the droplet being absorbed is sufficiently large, the equal spreading of liquid may cause the substrate to locally deform temporarily, i.e. a wave may move underneath the substrate and the substrate may react accordingly.

Figure 14B:
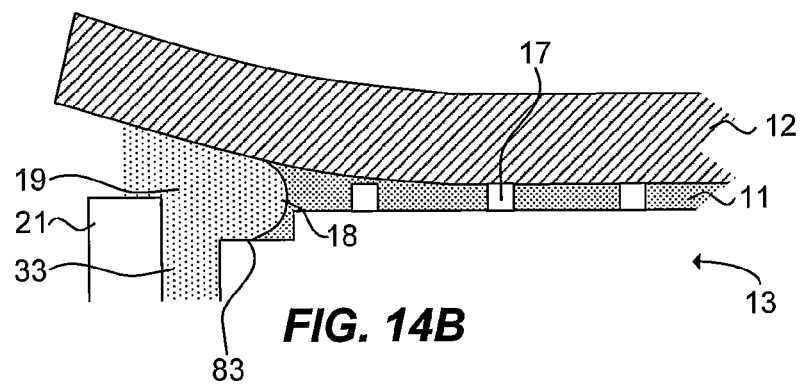
FIG. 14B schematically illustrates a substrate support structure according to yet another embodiment of the invention.

In order to limit such temporary local deformation as a result of absorbing a condensation droplet, the surface 16 of the substrate support structure 13 may be amended in a way as schematically shown in FIG. 14B. The substrate support structure 13 comprises a stepped portion 83 at the circumference of the surface having a slightly lower height. The remainder of the surface may have a single height level as shown in FIG. 14B, but may also have portions with different height levels, for example with contours as shown in and discussed with reference to FIGS. 8A, 8B, 9 and 12.

Due to the presence of the lower stepped portion 83, upon absorbing the droplet, the outer surface of the clamping layer expands into a region where the layer has a greater thickness. As a result, the flow of liquid caused by absorption of the droplet will be damped. As the meniscus curvature of the clamping layer while covering the lowest stepped portion is reduced in comparison to the meniscus curvature at other locations along the outer surface of the liquid clamping layer, a capillary flow will be induced that allows for retraction of the outer surface towards a position as shown in FIG. 14A. Due to this damping, temporary local deformations of the substrate 12 as discussed with reference to FIG. 14A will be limited.

Experiments have shown that a suitable height difference between the height level of the stepped circumscribing portion 83 and the main clamping surface corresponds to the nominal height of the substrate supporting structures 17. In other words, the height of the substrate supporting structures 17 and depth of the circumscribing portion 83 are preferably equal. The circumscribing portion 83 portion may be used for buffering clamping liquid for any of the embodiments of the substrate support structure.

Figure 15A:
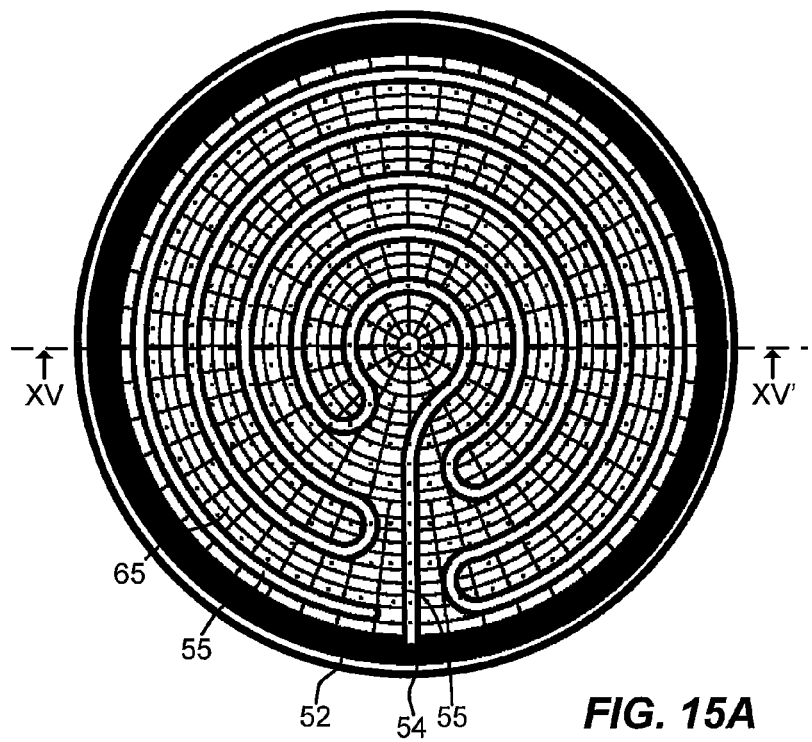
FIG. 15A is a top view of a substrate support structure according to yet another embodiment of the invention.
Figure 15B:
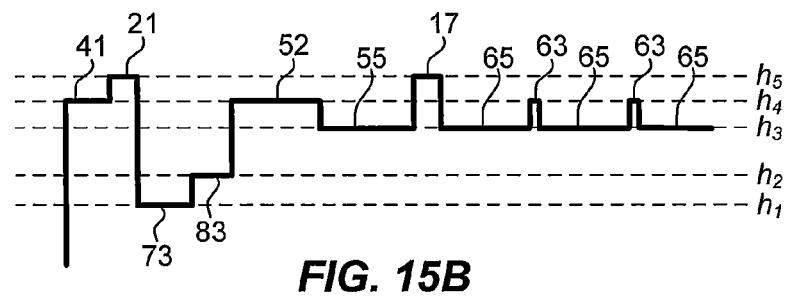
FIG. 15B is a cross-sectional view of a portion of the substrate support structure of FIG. 15A.

FIG. 15A is a top view of a substrate support structure according to yet another embodiment of the invention. In this embodiment, a number of features already discussed with reference to earlier embodiments are combined. FIG. 15B is a cross-sectional view of a portion of the substrate support structure of FIG. 15A, in particular the portion along the line XV-XV' as viewed in the direction of the arrows.

In the embodiment of FIG. 15A, the surface 16 is provided with a channel 55 formed between higher portions 52. The channel takes the form of a serpentine. The flow resistance in a clamping layer increases with flow distance, while the capillary pressure that overcomes this flow resistance remains the same independent of the flow distance. A serpentine channel form like the one shown in FIG. 15A reduces the distance over which a capillary flow needs to travel to replenish liquid to the outer surface. Consequently, this design is less sensitive to negative influences of flow resistance.

Figure 15C:
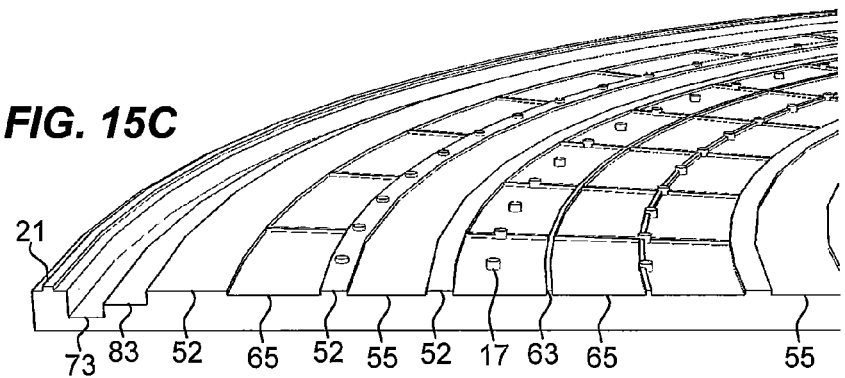
FIG. 15C is a perspective view of a portion of the structure of FIG. 15A.

FIG. 15B shows that this design comprises at least 5 height levels $h_1$-$h_5$. The first height level that has no real influence on the clamping operation is the height $h_1$ of the bottom of the moat 73. The lowest height of the substrate support structure is the height level $h_2$ of the circumscribing portion 83 used for buffering clamping liquid, for example in case of condensation. Height level $h_3$ in this embodiment is the low height level 51 of the remainder of the surface. In this embodiment, height level $h_4$ is the height level of the circumferential rim 41 as well as the height level of the higher portions 52 bounding the channel 55, and the elevated structures 63 creating compartments 65 for localizing voids and the like as explained earlier. Finally, height level $h_5$ in this particular embodiment corresponds to the height level of the substrate supporting elements 17 and the sealing structure 21. FIG. 15C is a perspective view on a portion of the design of FIG. 15A showing the elements discussed with reference to FIG. 15B in a slightly different configuration.

Figure 16:
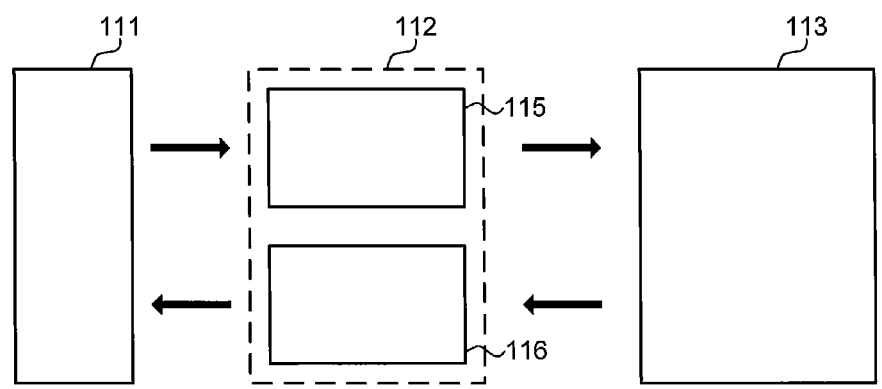
FIG. 16 schematically shows a substrate handling and exposure arrangement which may be used in conjunction with embodiments of the substrate support structure.
Figure 17:
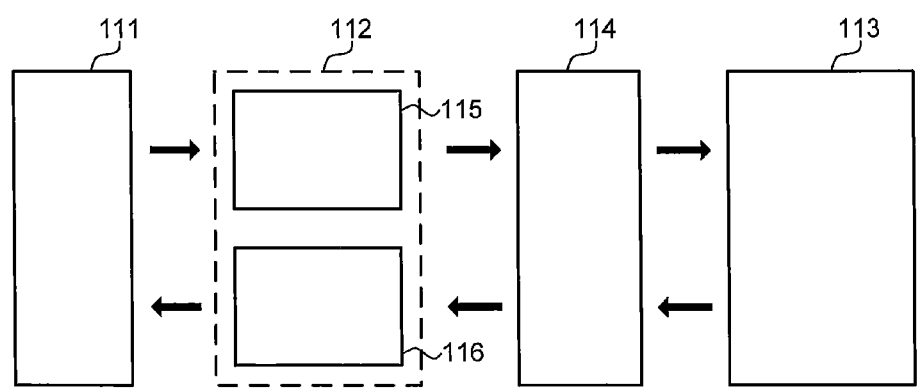
FIG. 17 schematically shows another substrate handling and exposure arrangement including a load lock chamber.

FIGS. 16 and 17 schematically show different substrate handling and exposure arrangements which may be used in conjunction with embodiments of the substrate support structures discussed earlier. FIGS. 16 and 17 will be explained with reference to an example related to lithographic processing of wafers. The substrates used in this application will be referred to as wafers. The substrate support structure used in this application will be referred to as wafer support structure. It must be understood that the arrangements are not limited to such an application.

Now referring to FIG. 16, in the substrate handling and exposure arrangement, a clamp preparation unit 112 is used to automate a method of clamping a wafer on a wafer support structure. The clamp preparation unit 112 accepts a wafer to be clamped from a substrate distribution facility, in this example a so-called wafer track 111. In the clamp preparation unit 112, the clamp is prepared, e.g. by using a method as outlined in U.S. patent application 61/154,411 herein included by reference in its entirety. After preparation of the clamp, the clamp is forwarded to a substrate processing unit, in this example a lithographic apparatus 113. The lithographic apparatus 113 may comprise a radiation system to provide a patterned beam of radiation, a substrate support structure to support a substrate, and an optical system to project the patterned beam of radiation onto a target portion of the substrate as will be understood by a person skilled in the art.

In FIG. 16, the clamping procedure is schematically denoted by reference number 115. The clamp preparation unit 112 comprises a vacuum system for providing a controlled pressure environment. The clamping procedure may start with the introduction of a wafer into the vacuum system of the clamp preparation unit 112, for example by means of a robot arm.

The wafer may be introduced via a vacuum tight door or a load lock chamber. The wafer support structure may already be present in the clamp preparation unit 112. Alternatively, the wafer support structure may be introduced in a similar way as the wafer.

Then, liquid may be applied onto the surface of the wafer support structure. The liquid may be applied by means of a liquid dispensing unit that provides a liquid flow. When a liquid layer of sufficient "thickness" is provided, the liquid flow is shut off. Preferably, the liquid dispensing unit is moveable within the clamp preparation unit 112 such that applying of liquid is performed in an efficient manner without disturbing earlier and subsequent actions in the clamping procedure.

Preferably, the pressure in the clamp preparation unit 112 during applying the liquid onto the surface of the wafer support structure is below ambient pressure, for example substantially equal to the vapor pressure of the liquid in the liquid layer.

The wafer and wafer support structure are then moved with respect to each other to allow placement of the wafer on the liquid layer. For this purpose, the wafer may be lowered onto the liquid layer by means of a wafer transfer unit. The first contact between the wafer and the liquid layer may be made at a tilt angle alpha ($\alpha$), preferably less than 10 degrees. Placement of the wafer on the liquid layer may be performed at ambient pressure, i.e. about 1 bar. However, placement at a lower pressure is preferred, for example a pressure substantially equal to the vapor pressure of the liquid in the liquid layer.

The wafer support structure may now be connected to one or more liquid connection units connectable to the wafer support structure for removing liquid away from the wafer support structure. Alternatively, connecting of these one or more liquid connection units is established earlier. After connection, excess liquid may be removed via the one or more liquid connection units. Removal of liquid may be performed at ambient pressure, i.e. about 1 bar.

Furthermore, the wafer support structure may comprise one or more gas connection units for connecting the wafer support structure with a gas supply. The gas connection units may establish a low pressure by "connection" to a vacuum. Additionally and/or alternatively, the gas connection units may provide a gas flow for enabling formation of a clamping layer between the wafer and the wafer support structure. Providing a gas flow may be performed at ambient pressure, i.e. about 1 bar. Note that the pressure provided by the gas flow needs to be lower than the ambient pressure to ensure that the wafer keeps its position with respect to the wafer support structure.

The clamp preparation unit may also perform conditioning of the substrate support structure before transfer to the lithographic apparatus. This may include, for example, cooling the substrate support structure or removing stored energy from the substrate support structure to a initiate a phase transition in a heat absorbing material in thermal contact with the substrate support structure surface.

Forwarding the clamped substrate may be performed by means of a robot arm via a vacuum tight door or a load lock chamber.

After processing in the lithographic apparatus 113, the clamped substrate may be transferred back to the clamp preparation unit 112 for unclamping, i.e. removing the wafer from the wafer support structure. In FIG. 16, the process of unclamping is schematically denoted by reference number 116. Unclamping may be performed by introducing the clamp into the clamp preparation unit 112, connecting the one or more liquid connectors to the wafer support structure. Via the one or more liquid connectors, additional liquid may be provided to the clamping layer such that the wafer starts to float on top of a liquid layer. The introduction of additional liquid may be applied in such a way that liquid pressure substantially homogeneously distributed so that the wafer will not deform or break.

At that stage, the wafer may be lifted from the liquid layer on the wafer substrate support surface, e.g. by means of support pins. Finally, the wafer may be extracted from the clamp preparation unit 112, for example by using a robot arm provided with wafer support, and transferred towards the wafer track 111.

In FIG. 16, the clamp preparation unit 112 and the lithographic apparatus 113 are depicted as separate units. However, it must be understood that it is also possible to integrate the clamp preparation unit 112 into a lithographic apparatus 113, for example by including the required functionality of the clamp preparation unit 112 in a load lock of the lithographic apparatus 113. In such a case, wafers will be clamped and unclamped as they enter and exit the lithographic apparatus respectively.

FIG. 17 shows another substrate handling and exposure arrangement including a load lock 114. The load lock receives a substrate clamped to a substrate support surface from the clamp preparation unit 112. The load lock comprises a vacuum chamber with vacuum pumps for pumping down to a vacuum suitable for transfer of the clamped substrate to the lithographic apparatus 113, and vents for venting to reduce the vacuum after processing of the clamped substrate in the lithographic apparatus.

Figure 18:
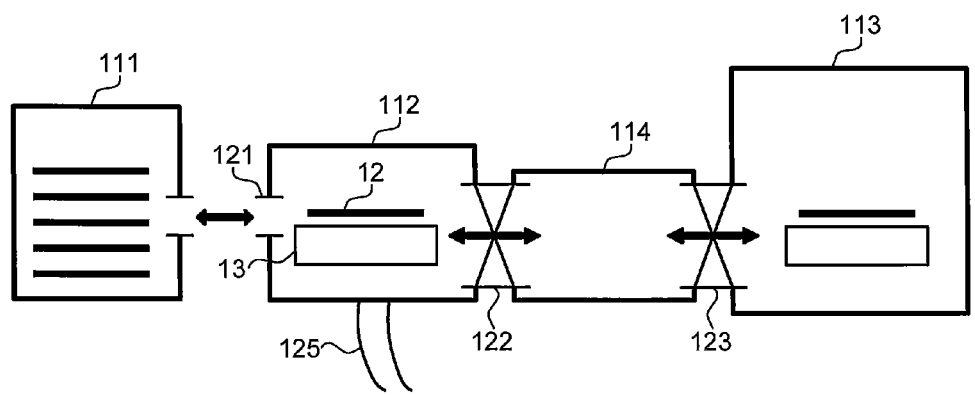
FIG. 18 shows further details of the substrate handling and exposure arrangement of FIG. 17.

FIG. 18 shows the substrate handling and exposure arrangement of FIG. 17 with ports for transfer of an unclamped substrate 12 from the wafer track 111, shown with multiple substrates in a cassette or supply arrangement. A substrate is loaded into the clamp preparation unit 112 via a loading port 121 sized for receiving an unclamped substrate. The substrate is clamped to the substrate support surface 13 and the clamped substrate is transferred via an unloading port 122 to the load lock chamber 114. Conditioning of the substrate support surface may also be performed in the clamp preparation unit. The load lock chamber is pumped down to a vacuum suitable for transfer of the clamped substrate via port 123 to the lithographic apparatus 113.

Figure 19:
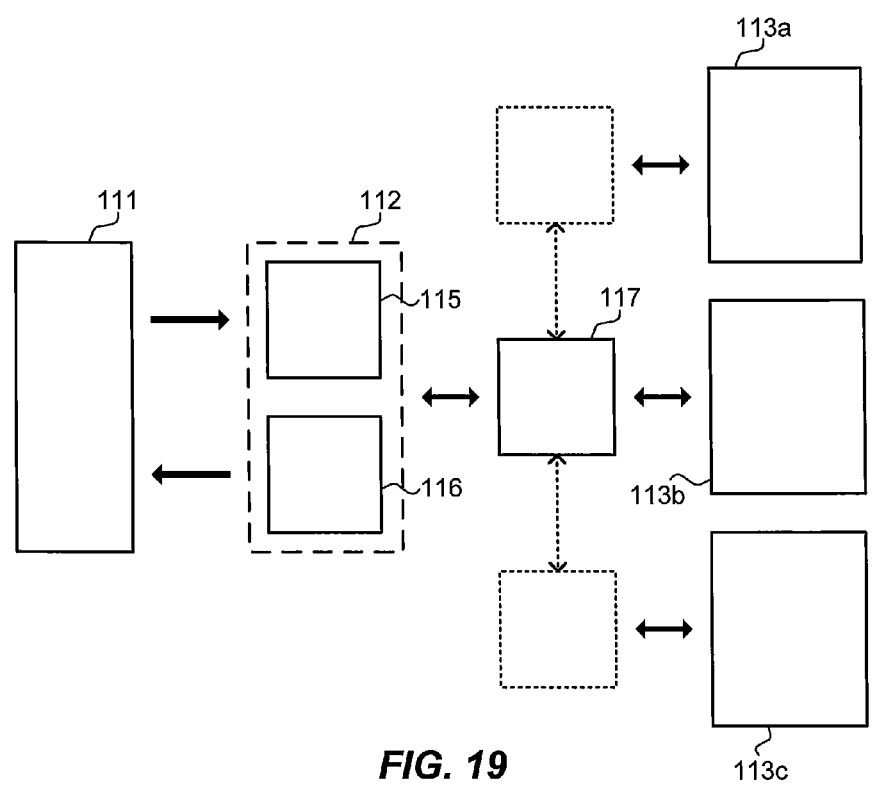
FIG. 19 schematically shows a different substrate handling and exposure arrangement that may be used in conjunction with embodiments of the substrate support structure.

FIG. 19 schematically shows a different substrate handling and exposure arrangement that may be used in conjunction with embodiments of the substrate support structure. In the arrangement of FIG. 19, instead of a single lithographic apparatus 113 more lithographic apparatus 113a, 113b, 113c are used. The functionality of the wafer track 111 and the clamp preparation unit 112 is the same as described with reference to FIG. 16.

In FIG. 19, a clamp ready to be transferred to a lithographic apparatus for processing may be transferred towards three different lithographic apparatus 113a, 113b, 113c via an additional wafer track 117. The configuration of FIG. 19 may be more efficient if the typical duration of the clamping method to be performed within the clamp preparation unit 112 is faster than the typical duration of a lithographic process to be performed in any one of the lithographic apparatus 113a, 113b, 113c.

As will be clear from the description above, inducing a capillary flow by using height differences of a substrate supporting structure surface provided with a clamping layer for holding a substrate can be performed for different purposes, for example evaporation control and condensation control. It must be understood that the invention is not limited to these purposes, but may also be applied to provide a solution for other issues related to the stability and reliability of a liquid clamping layer.

Throughout the description, reference has been made to the expression "clamping layer". The expression "clamping layer" should be understood to refer to a thin layer of liquid with a concave meniscus shape having a pressure below the pressure of its surrounding.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A substrate support structure for clamping a substrate by means of a capillary force created by a liquid clamping layer having a lower pressure than its surroundings and having an outer liquid surface, the substrate support structure comprising a surface provided with a plurality of substrate supporting elements for holding the substrate, the surface of the substrate support structure comprising a perimeter being circumscribed by a moat, and further comprising surface portions with different capillary potential for inducing, during clamping, a predetermined capillary flow within the liquid clamping layer to replenish evaporating liquid at locations within a portion of the surface of the substrate support structure with a higher capillary potential;
   wherein at least a part of the surface portions with a lower capillary potential takes the form of a channel, wherein the channel extends from a predetermined location along the perimeter, and wherein the channel is arranged to induce a capillary flow from the channel to the periphery of the liquid clamping layer.

2. The substrate support structure of claim 1, wherein the surface portions with different capillary potential further induce, during clamping, sacrificial gap development at one or more predetermined locations along the periphery of the liquid clamping layer.

3. The substrate support structure of claim 1, wherein the surface of the substrate support structure comprises the surface portions with a lower capillary potential at the perimeter of the substrate support structure surface at one or more predetermined locations while the majority of the perimeter has a higher capillary potential.

4. The substrate support structure of claim 1, wherein the substrate supporting elements are arranged in a regular pattern with a mutual pitch, and wherein the channel width is smaller than said mutual pitch.

5. The substrate support structure of claim 1, wherein the channel comprises a curved portion.

6. The substrate support structure of claim 1, wherein at least a part of the surface portions with a lower capillary potential takes the form of one or more channels.

7. The substrate support structure of claim 6, wherein the surface area of the one or more channels covers less than 25% of the substrate support structure surface.

8. The substrate support structure of claim 7, wherein the surface area of the one or more channels is homogeneously spread over the substrate support structure surface.

9. The substrate support structure of claim 8, wherein the surface portions with a lowest capillary potential is provided at the perimeter of the surface.

10. The substrate support structure of claim 9, wherein a height difference between the top surface of the substrate supporting elements and a height level of the surface portion with the lowest capillary potential circumscribing the remainder of the surface substantially equals twice the height of the substrate supporting elements provided on the surface portion with a lower capillary potential within the remainder of the surface of the substrate support structure.

11. The substrate support structure of claim 1, wherein the surface portions with a lowest capillary potential is provided at a circumference of the surface portions with a higher capillary potential.

12. The substrate support structure of claim 1, wherein the surface portions with different capillary potential have different height levels to provide a difference in capillary potential.

13. The substrate support structure of claim 1, wherein the surface portions with different capillary potential have different affinity for the clamping liquid to provide a difference in capillary potential.

14. The substrate support structure of claim 13, wherein the surface portions with different capillary potential have a differing surface treatment, surface material, or surface coating, to provide a difference in capillary potential.

15. The substrate support structure of claim 1, wherein the substrate support structure further comprises a liquid removal system for removing liquid circumferential to said surface.

16. The substrate support structure of claim 15, wherein the liquid removal system comprises a gas distribution system.

17. The substrate support structure of claim 16, wherein the gas distribution system comprises at least one gas inlet for providing gas, and at least one gas outlet for removing gas.

18. The substrate support structure of claim 16, wherein the substrate support structure further comprises a sealing structure circumscribing the substrate support structure surface such that gas provided by the gas distribution system can flow between the substrate support structure surface and the sealing structure.

19. The substrate support structure of claim 18, wherein the sealing structure has a height level corresponding with the height level of the plurality of substrate supporting elements.

20. The substrate support structure of claim 18, wherein the substrate supporting elements are arranged in a regular pattern with a mutual pitch, and the distance between the sealing structure and the nearest substrate supporting elements exceeds said mutual pitch.

21. The substrate support structure of claim 1, wherein the outer liquid surface is concave-shaped.

* * * * *